(12) United States Patent
Chen et al.

(10) Patent No.: US 6,629,813 B2
(45) Date of Patent: Oct. 7, 2003

(54) MICROELECTRONIC FABRICATION TOOL LOADING METHOD PROVIDING ENHANCED MICROELECTRONIC FABRICATION TOOL OPERATING EFFICIENCY

(75) Inventors: Yiau-Hweui Chen, Hukou (CN); Kerry Chiu, Hsin-Chu (TW); Raymond Chen, Hsin-Chu (TW); Larry Huang, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/837,074

(22) Filed: Apr. 18, 2001

(65) Prior Publication Data

US 2002/0154988 A1 Oct. 24, 2002

(51) Int. Cl.$^7$ ............................................. B65B 21/02
(52) U.S. Cl. ..................................................... 414/810
(58) Field of Search ................................ 414/403, 404, 414/156, 160, 416.01, 217, 217.01, 806, 800, 939, 805, 810, 940, 811, 933, 937, 938; 118/719; 432/239

(56) References Cited

U.S. PATENT DOCUMENTS

| 5,407,449 | A | * | 4/1995 | Zinger ..................... 414/935 X |
| 5,562,383 | A | * | 10/1996 | Iwai et al. |
| 5,674,039 | A | * | 10/1997 | Walker et al. .......... 414/940 X |
| 5,885,045 | A | | 3/1999 | Rush |
| 5,957,648 | A | | 9/1999 | Bachrach |
| 5,980,183 | A | | 11/1999 | Fosnight |
| 5,993,141 | A | * | 11/1999 | Wytman .................. 414/744.2 |
| 6,083,566 | A | * | 7/2000 | Whitesell ................ 414/940 X |

* cited by examiner

Primary Examiner—Christopher P. Ellis
Assistant Examiner—Richard Ridley
(74) Attorney, Agent, or Firm—Tung & Associates

(57) ABSTRACT

Within a method for operating a fabrication tool which requires transfer of a series substrates from a storage carrier to a process carrier when fabricating the series of substrates within the process carrier within the fabrication tool, a specific series of substrates is transferred from a storage carrier to a process carrier (and/or the reverse) simultaneously with fabricating a separate series of substrates within a process carrier within the fabrication tool. By employing the method, the fabrication tool may be operated more efficiently.

17 Claims, 2 Drawing Sheets

MICROELECTRONIC FABRICATION TOOL LOADING METHOD PROVIDING ENHANCED MICROELECTRONIC FABRICATION TOOL OPERATING EFFICIENCY

BACKGROUND OF THE INVENTION

1. Field of the Invention

The present invention relates generally to methods for loading microelectronic fabrication tools when fabricating microelectronic fabrications. More particularly, the present invention relates to methods for efficiently loading microelectronic fabrication tools when fabricating microelectronic fabrications.

2. Description of the Related Art

Integral to the fabrication of microelectronic fabrications is the use of a plurality of microelectronic fabrication tools for forming within and upon microelectronic substrates various microelectronic layers and various microelectronic structures which are employed for forming from microelectronic substrates microelectronic fabrications. Such microelectronic fabrication tools may include, but are not limited to, wet chemical process tools, vacuum process tools and atmospheric process tools.

Due to the plurality of microelectronic fabrication tools typically needed for fabricating microelectronic fabrications, in conjunction with a plurality of microelectronic fabrication part numbers typically fabricated within a microelectronic fabrication facility, it thus becomes important in the art of microelectronic fabrication to develop efficient methods and procedures for loading microelectronic fabrication tools, such as to in turn provide for enhanced operational efficiency of microelectronic fabrication tools employed for fabricating microelectronic fabrications.

It is towards the foregoing object that the present invention is directed.

Various methods, apparatus and systems have been disclosed within the art of microelectronic fabrication for positioning work-in-process (WIP) workload with respect to microelectronic fabrication tools when fabricating microelectronic fabrications within microelectronic fabrication facilities. Included among the methods, apparatus and systems, but not limited among the methods, apparatus and systems are methods, apparatus and systems disclosed within: (1) Rush, in U.S. Pat. No. 5,885,045 (an integrated system which provides for: (a) semiconductor substrate storage carrier within semiconductor substrate storage pod loading and unloading; (b) semiconductor substrate storage carrier to semiconductor fabrication tool transfer; and (c) semiconductor substrate storage carrier to semiconductor substrate process carrier transfer, when fabricating semiconductor substrates to provide semiconductor integrated circuit microelectronic fabrications); (2) Bachrach, in U.S. Pat. No. 5,957,648 (a method, system and apparatus which provide for handling, moving and storage of semiconductor substrate storage pods with respect to a semiconductor fabrication tool within a semiconductor fabrication facility when fabricating semiconductor integrated circuit microelectronic fabrications); and (3) Fosnight, in U.S. Pat. No. 5,980,183 (an integrated intrabay system which provides for storage and transport of semiconductor substrate pods within a multi-tool semiconductor fabrication bay within a semiconductor fabrication facility when fabricating semiconductor integrated circuit microelectronic fabrications). The disclosures of each of the foregoing references are incorporated herein fully by reference.

Desirable in the art of microelectronic fabrication are additional methods, apparatus and systems which may be employed for efficiently loading microelectronic fabrication tools when fabricating microelectronic fabrications.

It is towards the foregoing object that the present invention is directed.

SUMMARY OF THE INVENTION

A first object of the present invention is to provide a method for loading a microelectronic fabrication tool when fabricating a microelectronic fabrication.

A second object of the present invention is to provide a method in accord with the first object of the present invention, wherein the microelectronic fabrication tool is efficiently loaded.

A third object of the present invention is to provide a method in accord with the first object of the present invention and the second object of the present invention, wherein the method is readily commercially implemented.

In accord with the objects of the present invention, there is provided by the present invention a method for operating a fabrication tool.

Within the method for operating the fabrication tool there is first provided a fabrication tool which requires transfer of a series substrates from a storage carrier to a process carrier when fabricating the series of substrates within the process carrier within the fabrication tool. There is also provided a first series of substrates within a first storage carrier. There is then transferred the first series of substrates from the first storage carrier to a first process carrier. There is then processed the first series of substrates within the first process carrier within the fabrication tool. There is also provided a second series of substrates within a second storage carrier. Finally, there is then transferred the second series of substrates from the second storage carrier to a second process carrier while processing the first series of substrates within the first process carrier within the fabrication tool.

Further in accord with the method of the present invention, there is also processed the second series of substrates within the second process carrier within the fabrication tool after processing the first series of substrates within the first process carrier within the fabrication tool. Similarly, there is also provided a third series of substrates within a third storage carrier. Finally, there is also transferred at least one of: (1) the first series of substrates from the first process carrier to the first storage carrier; and (2) the third series of substrates from the third storage carrier to a third process carrier, while processing the second series of substrates within the second process carrier within the fabrication tool.

The present invention provides a method for loading a microelectronic fabrication tool when fabricating a microelectronic fabrication, wherein the microelectronic fabrication tool is efficiently loaded.

The method of the present invention realizes the foregoing object within the context of a fabrication tool which requires transfer of a series substrates from a storage carrier to a process carrier for fabricating the series of substrates within the process carrier within the fabrication tool by transferring a specific series of substrates from a storage carrier to a process carrier (and/or the reverse) when processing an additional specific series of substrates within a process carrier within the fabrication tool.

The method of the present invention is readily commercially implemented.

As will be illustrated in greater detail within the context of the Description of the Preferred Embodiment, as set forth below, the method of the present invention may be implemented within fabrication facilities, and while employing fabrication equipment and fabrication tools, as are otherwise generally conventional in the art of microelectronic fabrication. Since it is thus an operational method which provides at least in part the present invention, rather than the existence of fabrication equipment and fabrication tooling which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for loading a microelectronic fabrication tool when fabricating a microelectronic fabrication, wherein the microelectronic fabrication tool is efficiently loaded.

The method of the present invention realizes the foregoing object within the context of a fabrication tool which requires transfer of a series substrates from a storage carrier to a process carrier when fabricating the series of substrates within the process carrier within the fabrication tool by transferring a specific series of substrates from a storage carrier to a process carrier (and/or the reverse) when processing another specific series of substrates within a process carrier within the fabrication tool.

Although the present invention and the preferred embodiment of the present invention provide particular value within the context of fabricating within a semiconductor fabrication tool a plurality of series (i.e., a plurality of lots or a plurality of batches of lots) of semiconductor substrates, the present invention may be employed for fabricating microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Similarly, although the present invention and the preferred embodiment of the present invention provide particular value within the context of fabricating within a batch vacuum process semiconductor fabrication tool the plurality of series (i.e., plurality of lots or plurality of batches of lots) of semiconductor substrates, the present invention may in general be employed within the context of fabrication tools including but not limited to wet chemical process fabrication tools, vacuum process fabrication tools and atmospheric process fabrication tools.

Figure 1:
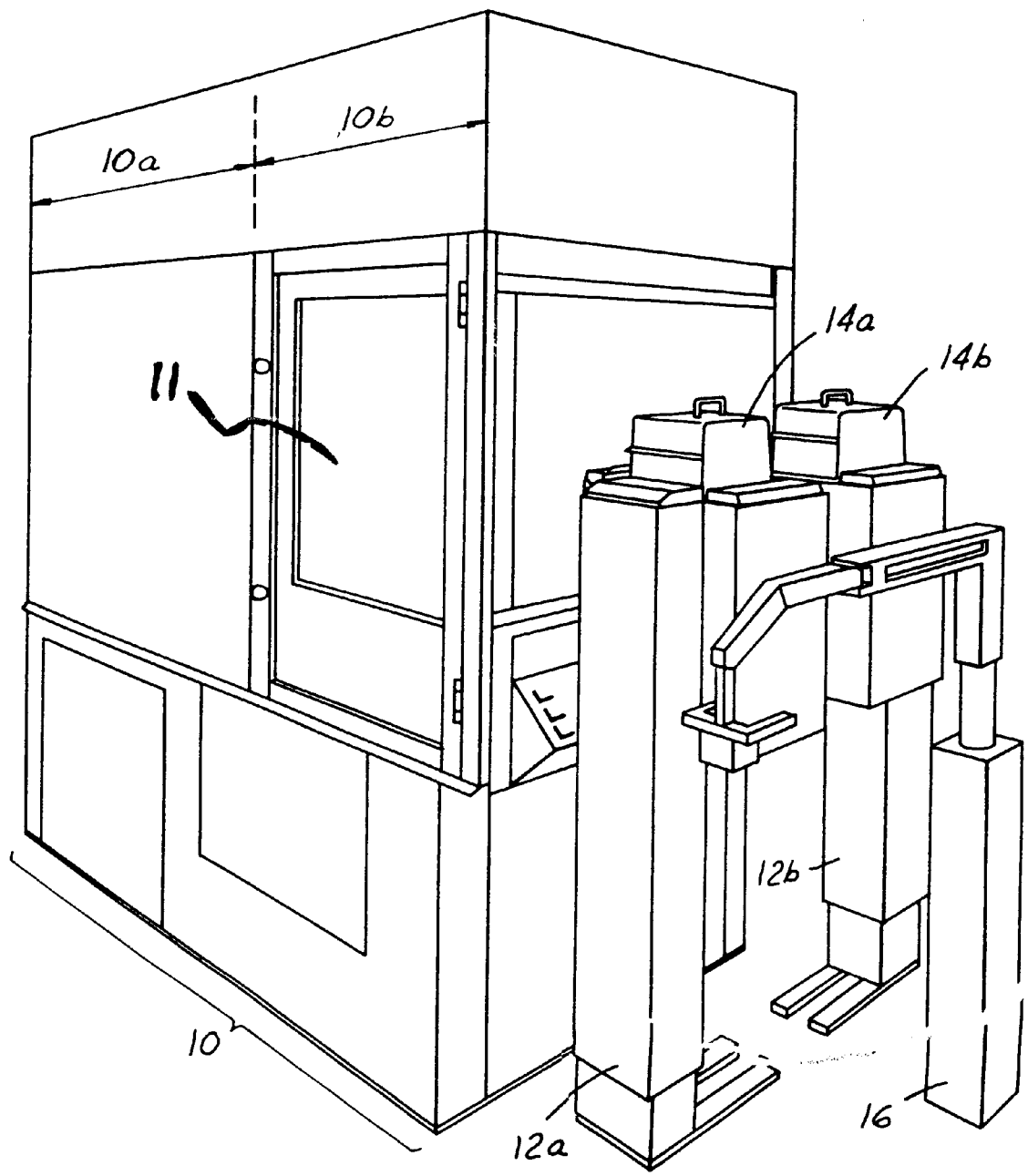
FIG. 1 shows a schematic isometric diagram in part illustrating a microelectronic fabrication tool with respect to which may be practiced the method of the present invention.

Referring now to FIG. 1, there is shown a schematic isometric diagram in part illustrating a fabrication tool with respect to which may be practiced the method of the present invention.

Shown in FIG. 1 is a fabrication tool 10 having positioned in proximity thereto a pair of input/output stations 12a and 12b which services the fabrication tool 10. In turn, each of the pair of input/output stations 12a and 12b which services the fabrication tool 10 has positioned thereupon a corresponding substrate storage pod 14a or 14b in turn having contained therein a substrate storage carrier (not specifically illustrated) which in turn has contained therein a series of substrates (not specifically illustrated) to be fabricated within the fabrication tool 10. Finally, as is illustrated within the schematic isometric diagram of FIG. 1, there is shown a storage pod handler robot 16 in the vicinity of the pair of input/output stations 12a and 12b, wherein the storage pod handler robot 16 is designed and positioned such as to transfer substrate storage pods, such as the substrate storage pods 14a and 14b, between the input/output stations 12a and 12b and various storage and transport facilities (not specifically illustrated) within the microelectronic fabrication facility within which is employed the fabrication tool 10.

Although not specifically illustrated, such storage and transport facilities may be of a variety as disclosed within the prior art references cited within the Description of the Related Art, the disclosures of which prior art references are incorporated herein fully by reference. Implicit within the foregoing disclosure and explicit within the prior art references cited within the Description of the Related Art is that the storage and transport facilities are external to the fabrication tool 10.

As is further illustrated within the schematic isometric diagram of FIG. 1, the fabrication tool 10 comprises: (1) a fabrication compartment 10a within which a series of substrates is fabricated, as a lot or a batch of lots, to provide a series of fabricated substrates; as well as (2) a transfer compartment 10b integral with the fabrication compartment 10a, wherein within the transfer compartment 10b the series of substrates fabricated as the lot or the batch of lots within the fabrication compartment 10a is first transferred from a substrate storage carrier (from within either or both of the substrate storage pods 14a and 14b) to a substrate process carrier, such that the series of substrates may be fabricated within the fabrication compartment 10a of the fabrication tool 10. Within the invention, the preceding transfer of substrates from a substrate storage carrier to a substrate process carrier is effected within a transfer apparatus 11 which is shown in block form. Insofar as the invention may be employed within the context of various fabrication tools, the transfer apparatus 11 will typically implicitly or inherently be designed within the context of a fabrication tool and its specific substrate process carrier, as are otherwise generally conventional in the art. For example and without limitation, Rush, as cited within the Description of the Related Art which is incorporated herein fully by reference, discloses a non-limiting example of a transfer apparatus, a substrate storage carrier and a substrate process carrier which may be employed within the context of the invention. As is understood by a person skilled in the art, the fabrication tool 10 as illustrated within the schematic isometric diagram of FIG. 1 is typically and preferably a lot or batch fabrication tool, in comparison with a single substrate fabrication tool, as is otherwise also known in the art of microelectronic fabrication.

Within the preferred embodiment of the present invention with respect to the pair of input/output stations 12a and 12b having positioned thereupon the pair of substrate storage pods 14a and 14b, the pair of input/output stations 12a and 12b is otherwise also generally conventional in the art of microelectronic fabrication, and will typically and preferably include incorporated therein an elevator mechanism which might assist in positioning a substrate within a substrate storage carrier within either of the substrate storage pods 14a and 14b with respect to a transfer apparatus within the transfer compartment 10b, such as to effect efficient transfer of the series of substrates within the pair of substrate storage carriers within the pair of substrate storage pods 14a and 14b to a substrate process carrier within the transfer chamber 10b. The substrate process carrier may be of dimensions analogous or equivalent to the dimensions of a substrate storage carrier contained within a substrate storage pod (which will typically and preferably occur when the fabrication tool 10 comprises a wet chemical process tool) or in the alternative, the substrate process carrier may be of dimensions not analogous or equivalent with the dimensions of a substrate storage carrier contained within a substrate storage pod (which will typically and preferably occur when the fabrication tool comprises a vacuum process tool or an atmospheric process tool). Within the latter circumstance with respect to vacuum process tools, the substrate process carrier may be intended as a susceptor carrier apparatus or alternative carrier apparatus which disposes a series of substrates in a flat or domed shaped configuration within a vacuum process tool when depositing a microelectronic layer, such as a conductor layer, a semiconductor layer or a dielectric layer, upon each of the series of substrates.

Similarly, within the preferred embodiment of the present invention with respect to the storage pod handler robot 16, the storage pod handler robot 16 typically and preferably employs a standard mechanical interface (SMIF) end effector manipulator such as to mate with each of the pair of substrate storage pods 14a and 14b (as are otherwise generally conventional in the art of microelectronic fabrication), which similarly also employ a standard mechanical interface (SMIF) mated to the standard mechanical interface (SMIF) end effector manipulator of the storage pod handler robot 16.

Within the preferred embodiment of the present invention, and in general with respect to the fabrication tool 10 as illustrated within the schematic isometric diagram of FIG. 1, the fabrication tool 10 will typically and preferably process up to about 50, but more typically and preferably from about 8 to about 15 substrates within one lot or one batch of multiple lots within one process cycle within the fabrication compartment 10a when fabricating the one lot or one batch of multiple lots of substrates to provide one lot or one batch of multiple lots of fabricated substrates from the fabrication tool 10. As noted above, the fabrication tool may be selected from the group including but not limited to wet chemical process fabrication tools, vacuum process fabrication tools and atmospheric process fabrication tools, but more typically and preferably a vacuum process fabrication tool employed for depositing a microelectronic layer, and more typically and preferably a microelectronic dielectric layer, upon a substrate.

Figure 2:
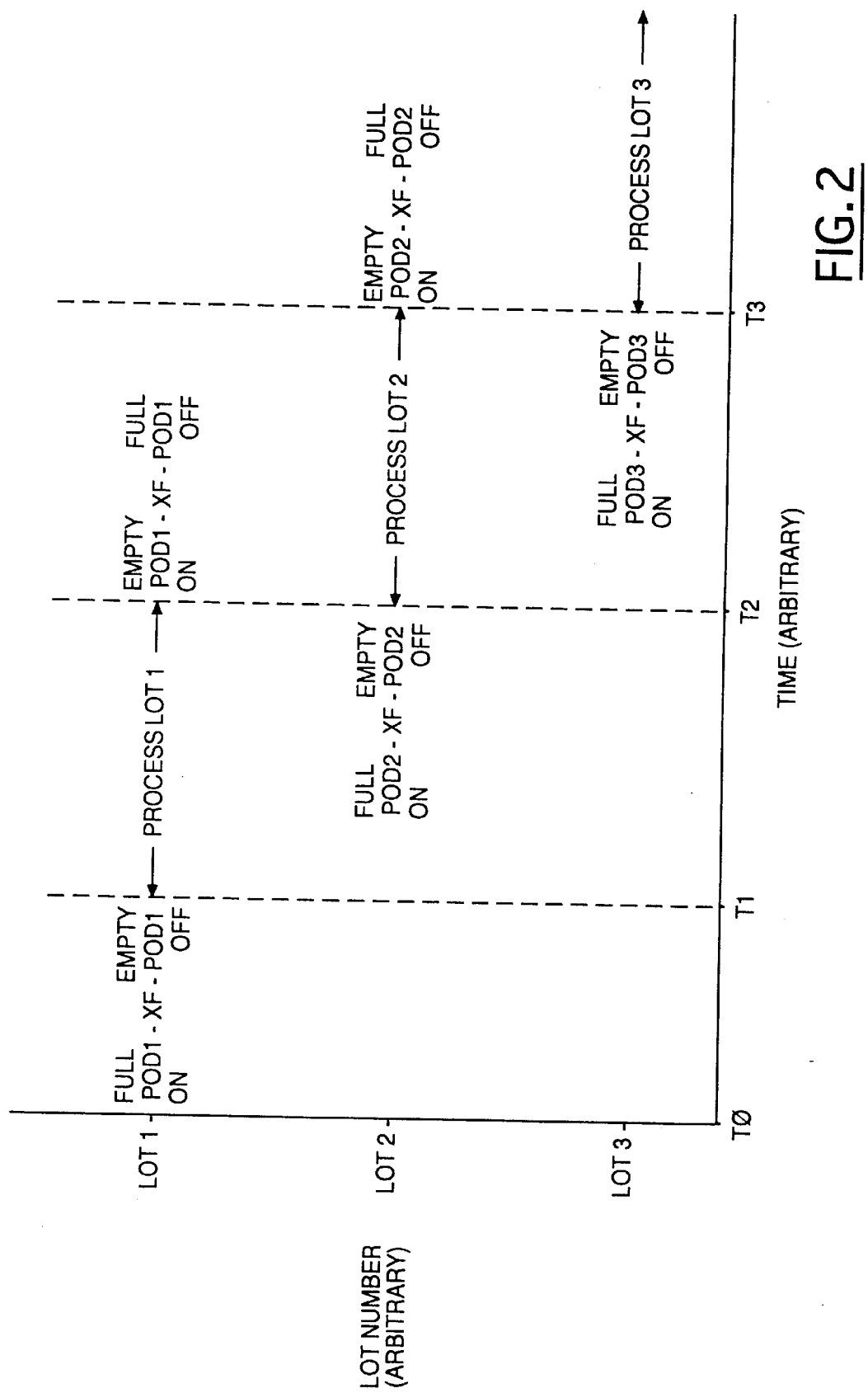
FIG. 2 shows a schematic process flow diagram directed towards processing of a series of lots of substrates within a microelectronic fabrication tool in accord with the method of the present invention.

Referring now to FIG. 2, there is shown a schematic process flow diagram illustrating the results of progressive stages in fabricating a series of lots of substrates within a fabrication tool, such as the fabrication tool 10 whose schematic isometric diagram is illustrated in FIG. 1, while employing the method of the present invention.

Shown in FIG. 2, overall, is a schematic diagram which illustrates a process sequencing for a series of three lots of substrates fabricated within the fabrication tool within a series of arbitrary time intervals.

As is illustrated within the schematic diagram of FIG. 2 with respect to processing of the first lot of substrates within the fabrication tool: (1) a first substrate storage pod at least partially full of substrates is first positioned upon an input-output station; (2) at least some of the substrates are then transferred from a first substrate storage carrier therein to a first substrate process carrier within the fabrication tool; and (3) the first substrate storage pod at least partially emptied of substrates is removed from upon the input/output station. This grouping of process steps occurs during a time interval T1 minus T0, and is represented as Full Pod 1 On/XF/Empty Pod 1 Off, within the schematic process flow diagram of FIG. 1. The first lot of substrates is then processed within the fabrication tool during a time interval T2 minus T1, as indicated within the schematic process flow diagram of FIG. 1 by PROCESS LOT 1. The at least partially emptied first substrate storage pod is then repositioned upon the input/output station, the series of fabricated substrates are then transferred from the first substrate process carrier to the first substrate storage carrier within the first substrate storage pod and the at least partially refilled first substrate storage pod is removed from upon the input/output station. This series of process steps occurs within a time interval T3 minus T2, and is illustrated within the schematic process flow diagram of FIG. 2 as Empty Pod 1 On/XF/Full Pod 1 Off.

As is further illustrated within the schematic process flow diagram of FIG. 2, there is shown an analogous processing sequence for processing of a second lot of substrates, as well as (in part) an analogous processing sequence for processing of a third lot of substrates. As is illustrated within the schematic diagram of FIG. 2, the processing sequences for the first lot of substrates, the second lot of substrates and the third lot of substrates are offset, with the processing of the first lot of substrates occurring within a time interval of T2 minus T1, the processing of the second lot of substrates occurring within a time interval of T3 minus T2 and the processing of the third lot of substrates occurring within a time interval starting with T3. Within the present invention and the preferred embodiment of the present invention, a processing of a lot of substrates within a fabrication chamber within a fabrication tool is intended as starting by moving into the fabrication chamber a substrate process carrier filled with a lot of substrates to be fabricated within the fabrication tool and ending when there is removed from the fabrication tool the substrate process carrier filled with a lot of corresponding fabricated substrates which have been fabricated within the fabrication tool.

Significant to the present invention is that once steady state substrate fabrication operations are underway, the transfer of a lot or batch of lots of substrates from a substrate storage carrier to a substrate process carrier (and the reverse) occurs at least in part while simultaneously processing a separate lot or batch of lots of substrates within a fabrication tool. By undertaking such a transfer of a lot or batch of lots of substrates from a substrate storage carrier to a substrate process carrier (or the reverse) at least in part while simultaneously fabricating a separate lot or batch of lots of substrates within the fabrication tool, the fabrication tool may be operated efficiently insofar as a fabrication chamber within a fabrication compartment of the fabrication tool need not be unnecessarily idled while a lot or batch of lots of substrates is transferred from a substrate storage carrier to a substrate process carrier (or the reverse).

As is understood by a person skilled in the art, the preferred embodiment of the present invention is illustrative of the present invention rather than limiting of the present invention. Revisions and modifications may be made to fabrication tools, fabrication processes and substrates employed within the context of the preferred embodiment of the present invention while still providing a method for operating a fabrication tool in accord with the present invention, further in accord with the accompanying claims.

What is claimed is:

1. A method for operating a fabrication tool comprising:

providing a fabrication tool which requires transfer of a lot of substrates from a storage carrier to a process carrier when fabricating the lot of substrates within the process carrier within the fabrication tool, the fabrication tool having associated therewith a transfer apparatus for transfer of the lot of substrates from the storage carrier to the process carrier and an input/output station for receiving the storage carrier and positioning the same with respect to the transfer apparatus;

providing a first lot of substrates within a first storage carrier upon the input/output station;

transferring, while employing the transfer apparatus, the first lot of substrates from the first storage cater to a first process carrier, removing the emptied first storage carrier from the input/output station and storing the same in a storage facility provided external to the fabrication tool;

processing, for a first process time interval, the first lot of substrates within the first process carrier within the fabrication tool while:

providing a second lot of substrates within a second storage carrier upon the input/output station;

transferring, while employing the transfer apparatus, the second lot of substrates from the second storage carrier to a second process carrier; and removing the emptied second storage carrier from the input/output station and storing the same in the storage facility provided external to the fabrication tool.

2. The method of claim 1 further comprising:

processing, for a second process time interval, the second lot of substrates within the second process carrier within the fabrication tool alter processing the first lot of substrates within the first process carrier within the fabrication tool for the first process time interval, wherein during the second process time interval at least one of:

the emptied first storage carrier is returned to the input/output station, the first lot of substrates as processed is transferred thereto from the first process carrier and the first storage carrier is removed from the input/output station; and a third lot of substrates within a third storage carrier is provided upon the input/output station, the third lot of substrates is transferred to a third process carrier and the emptied third storage carrier is removed from the input/output station.

3. The method of claim 2 wherein the first lot of substrates, the second lot of substrates and the third lot of substrates are employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein the fabrication tool is a batch fabrication tool selected from the group consisting of wet chemical process batch fabrication tools, vacuum process batch fabrication tools and atmospheric process batch fabrication tools.

5. The method of claim 1 wherein the fabrication tool is a vacuum process batch fabrication tool.

6. The method of claim 2 wherein a number of substrates within the first lot of substrates, the second lot of substrates and the third lot of substrates is up to about 50.

7. The method of claim 2 wherein at least the first storage carrier and the second storage carrier are contained within a corresponding first storage pod and second storage pod positioned within the vicinity of the fabrication tool by a storage pod handling robot.

8. The method of claim 2 wherein there is transferred both of:

the first lot of substrates from the first process carrier to the emptied first storage carrier; and the third lot of substrates from the third storage carrier to a third process carrier, while processing the second lot of substrates within the second process carrier within the fabrication tool for the second process time interval.

9. A method for operating a fabrication tool comprising:

providing a fabrication tool which requires transfer of a lot of semiconductor substrates from a storage carrier to a process carrier when fabricating the lot of semiconductor substrates within the process carrier within the fabrication tool, the fabrication tool having associated therewith a transfer apparatus for transfer of the lot of semiconductor substrates from the storage carrier to the process carrier and an input/output station for receiving the storage carrier and positioning the same with respect to the transfer apparatus;

providing a first lot of semiconductor substrates within a first storage carrier upon the input/output station;

transferring, while employing the transfer apparatus, the first lot of semiconductor substrates from the first storage carrier to a first process carrier, removing the first storage carrier from the input/output station and storing the same in a storage facility provided external to the fabrication tool;

processing, for a first process time interval, the first lot of semiconductor substrates within the first process carrier within the fabrication tool while:

providing a second lot of semiconductor substrates within a second storage carrier upon the input/output station;

transferring, while employing the transfer apparatus, the second lot of semiconductor substrates from the second storage carrier to a second process carrier; and removing the emptied second storage carrier from the input/output station and storing the same in the storage facility provided external to the fabrication tool.

10. The method of claim 9 further comprising:

processing, for a second process time interval, the second lot of semiconductor substrates within the second process carrier within the fabrication tool after processing the first lot of semiconductor substrates within the first process carrier within the fabrication tool, wherein during the second process time interval at least one of:

the emptied first storage carrier is returned to the input/output station, the first lot of substrates as processed is transferred thereto from the first process carrier and the first storage carrier is removed from the input/output station; and a third lot of substrates within a third storage carrier is provided upon the input/output station, the third lot of substrates is transferred to a third process carrier and the emptied third storage carrier is removed from the input/output station.

11. The method of claim 9 wherein the fabrication tool is a batch fabrication tool selected from the group consisting of wet chemical process batch fabrication tools, vacuum process batch fabrication tools and atmospheric process batch fabrication tools.

12. The method of claim 9 wherein the fabrication tool is a vacuum process batch fabrication tool.

13. The method of claim 10 wherein a number of substrates within the first lot of semiconductor substrates, the second lot of semiconductor substrates and the third lot of semiconductor substrates is up to about 50.

14. The method of claim 10 wherein at least the first storage carrier and the second storage carrier are contained within a corresponding first storage pod and second storage pod positioned within the vicinity of the fabrication tool by a storage pod handling robot.

15. The method of claim 10 wherein there is transferred both of:
    the first lot of semiconductor substrates from the first process carrier to the emptied first storage carrier; and
    the third lot of semiconductor substrates from the third storage carrier to a third process carrier, while processing the second lot of semiconductor substrates within the second process carrier within the fabrication tool for the second process time interval.

16. The method of claim 1 wherein the transfer apparatus is integral to the fabrication tool.

17. The method of claim 9 wherein the transfer apparatus is integral to the fabrication tool.

* * * * *